United States Patent
Niederlöhner

(10) Patent No.: US 10,761,174 B2
(45) Date of Patent: Sep. 1, 2020

(54) RECORDING A B0 MAP OF A MAIN MAGNETIC FIELD OF A MAGNETIC RESONANCE DEVICE IN AN IMAGING VOLUME OF WHICH AN OBJECT TO BE RECORDED IS ARRANGED

(71) Applicant: Siemens Healthcare GmbH, Erlangen (DE)

(72) Inventor: Daniel Niederlöhner, Erlangen (DE)

(73) Assignee: Siemens Healthcare GmbH, Erlangen (DE)

(*) Notice: Subject to any disclaimer, the term of this patent is extended or adjusted under 35 U.S.C. 154(b) by 81 days.

(21) Appl. No.: 16/114,191

(22) Filed: Aug. 27, 2018

(65) Prior Publication Data
US 2019/0064303 A1    Feb. 28, 2019

(30) Foreign Application Priority Data
Aug. 28, 2017   (DE) .................. 10 2017 215 002

(51) Int. Cl.
*G01R 33/565* (2006.01)
*G01R 33/24* (2006.01)
*G01R 33/3875* (2006.01)
*G01R 33/54* (2006.01)

(52) U.S. Cl.
CPC ..... *G01R 33/56563* (2013.01); *G01R 33/243* (2013.01); *G01R 33/3875* (2013.01); *G01R 33/543* (2013.01)

(58) Field of Classification Search
USPC ................................. 324/300–322
See application file for complete search history.

(56) References Cited

U.S. PATENT DOCUMENTS

| 8,379,946 B2 | 2/2013 | Greiser et al. |
| 8,941,381 B2 * | 1/2015 | Feinberg ............ G01R 33/4835 324/307 |
| 2015/0362578 A1 | 12/2015 | Biber et al. |

(Continued)

OTHER PUBLICATIONS

German Office Action for German Application No. 102017215002.5, dated Apr. 26, 2018.

(Continued)

*Primary Examiner* — Jay Patidar
(74) *Attorney, Agent, or Firm* — Lempia Summerfield Katz LLC

(57) ABSTRACT

A method for recording a B0 map of a main magnetic field of a magnetic resonance device in an imaging volume of which an object to be recorded is arranged includes scanning a recording region to be covered by the B0 map by the magnetic resonance device. The recording region is scanned by a map recording sequence slice-by-slice in successive slices in a slice selection direction extending in a phase encoding direction and a readout direction, or three-dimensionally using two phase encoding directions and one readout direction in order to ascertain the B0 map. In a preliminary scan, the magnetic resonance device ascertains extension information describing the extension of the object using a scout sequence, which is used to define the recording region in sequence parameters of the map recording sequence and/or to adjust at least one sequence parameter of the map recording sequence.

15 Claims, 2 Drawing Sheets

(56) References Cited

U.S. PATENT DOCUMENTS

2018/0011158 A1* 1/2018 Katscher ............... A61B 5/055

OTHER PUBLICATIONS

Salomir, Rares, Baudouin Denis de Senneville, and Chrit TW Moonen. "A fast calculation method for magnetic field inhomogeneity due to an arbitrary distribution of bulk susceptibility." Concepts in Magnetic Resonance Part B: Magnetic Resonance Engineering: An Educational Journal 19.1 (2003): 26-34.

* cited by examiner

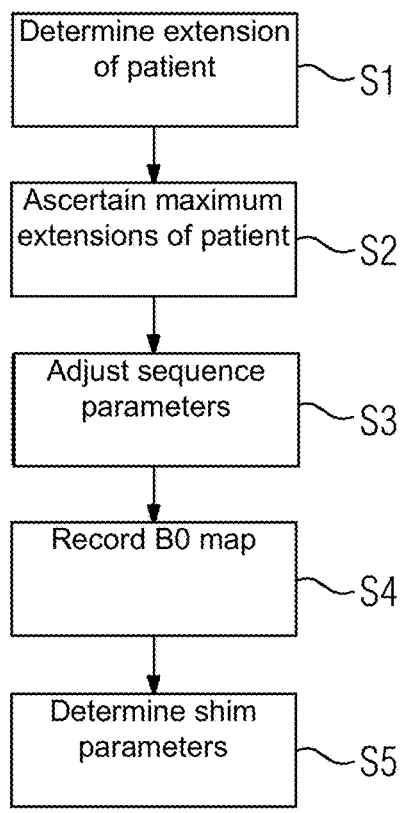
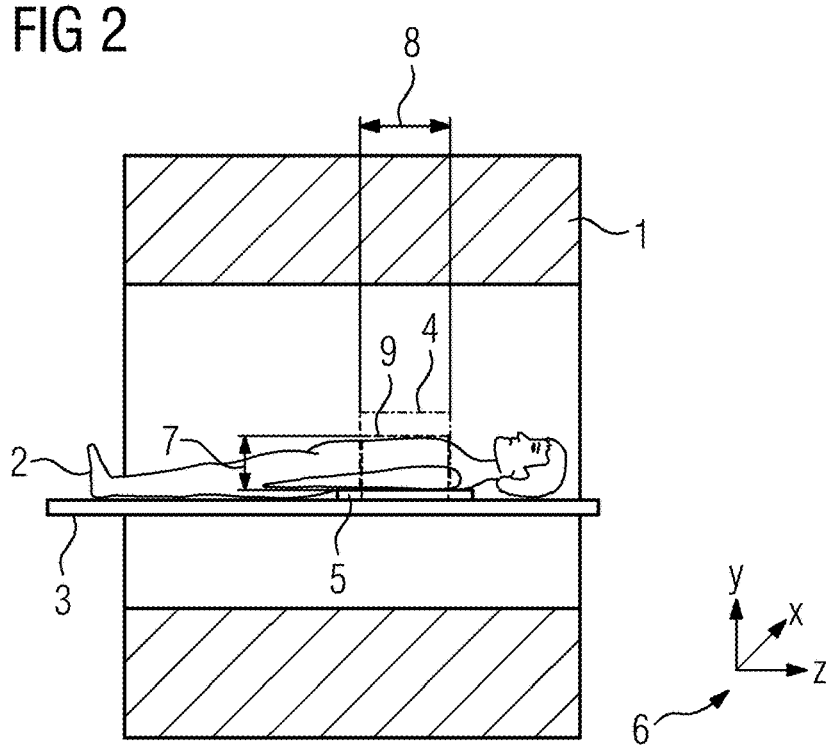

RECORDING A B0 MAP OF A MAIN MAGNETIC FIELD OF A MAGNETIC RESONANCE DEVICE IN AN IMAGING VOLUME OF WHICH AN OBJECT TO BE RECORDED IS ARRANGED

This application claims the benefit of DE 10 2017 215 002.5, filed on Aug. 28, 2017, which is hereby incorporated by reference in its entirety.

BACKGROUND

The present embodiments relate to recording a B0 map of a main magnetic field of a magnetic resonance device in the imaging volume of which an object to be recorded is arranged.

Magnetic resonance imaging (MRI) is based on spins of atomic nuclei aligned in a main magnetic field (B0 field). For many applications, the homogeneity of the main magnetic field (e.g., a field strength that is as constant as possible in the large possible three-dimensional volume) is of importance for the image quality and also for the spatial registration of magnetic resonance images since inhomogeneities may result in distortion. Present-day superconducting main field magnets enable main magnetic field homogeneities with deviations of less than 1 ppm across a volume of 30 to 40 cm ball diameter, which may then be typically referred to as the homogeneity volume of the magnetic resonance device. Inhomogeneity problems may, for example, occur when outer regions of the anatomy of a patient (e.g., the shoulder) are to be recorded, since, due to the lack of space in the patient receiving region of a magnetic resonance device, these may not be positioned centrally.

The body of a patient introduced into the main magnetic field generates additional inhomogeneities. Human tissue has a relative magnetic permeability that differs from one. For example, discontinuities between air and tissue produce significant distortion of the main magnetic field. The inhomogeneous distribution of water/air/bone/fat in the human body also results in another distortion of the main magnetic field that is different for each patient.

While inhomogeneities of the main magnetic field induced by the magnetic resonance device and the environment thereof may be corrected by permanent measures (e.g., static shim devices), dynamic shim devices are used for main magnetic field inhomogeneities caused by the introduced object in order to restore homogeneity to the greatest extent possible. Thus, the influence of dynamic shim devices on the main magnetic field may be adjusted, where generally shim coils are used as dynamic shim devices. Herein, shim coils may be used as part of the gradient coil or also as local shim coils (e.g., as part of local coil arrangements).

Parameterization of dynamic shim devices for a specific patient (e.g., to determine suitable currents through the shim coils) requires knowledge of the status of the main magnetic field (e.g., the inhomogeneity). It is known to calculate a B0 map (e.g., main magnetic field map) that may describe the B0 distribution directly or indirectly (e.g., by phase differences) by the magnetic resonance device with a patient already positioned therein. With a specific spatial resolution (e.g., in the range of two to ten millimeters), inhomogeneity is determined three-dimensionally in the imaging volume or in the homogeneity volume (e.g., by calculating the local Larmor frequency). The calculation of the B0 map is performed as part of the "adjustment" before the actual imaging scan and is comparatively time-consuming (e.g., ranging from 15 to over 30 seconds). As part of the adjustment, then, for example, shim parameters (e.g., shim currents) are also ascertained and set.

Known procedures calculate the greatest possible volume or the entire homogeneity volume of the magnetic resonance device in order to calculate the B0 map. Herein, the examination object or a proportional occupation of the homogeneity volume may be acquired completely at the specified position of a patient table of the magnetic resonance device so that the B0 map provides sufficient information for each arbitrary adjustment volume (e.g., in which the homogeneity is to be established and which may be requested subsequently from an imaging scan).

For example, with the double-echo steady state (DESS) shim, with which the calculation of the B0 map is based on a DESS magnetic resonance sequence as a map recording sequence (e.g., a FADE sequence (fast double echo)), a volume of approximately 500 mm×450 mm×450 to 500 mm is acquired. This corresponds to the complete homogeneity volume of the magnetic resonance device minus a constraint in the vertical direction due to the patient bench. In the majority of cases, an unnecessarily large volume is acquired, thus resulting in a loss of time.

Special gradient-echo based main field map scans with adjusted volumes and resolutions have also been suggested for special applications, thus achieving a small saving on scan time or enabling the same for resolutions. However, this only achieves an adjustment for special imaging sequences.

It is not possible to achieve a saving on scan time by automatically constraining the recording region for the B0 field map to the recording region of a subsequent imaging sequence, since the coverage of the B0 map is not sufficient for a subsequent imaging scan with a larger/different recording region, and this would require a completely new recording.

The scan time is generally dominated by the repetition time (TR), the number of slices to be recorded, and the number of phase-encoding steps. In the case of map recording sequences for calculating a B0 field map in a recording region, the repetition time is selected as minimal and is oriented with respect to the necessary echo times of the corresponding map recording sequence so that the repetition time may not be adjusted as a free parameter. Hence, in the case of a more or less fixed image element size, the number of image elements in the phase-encoding direction and the number of slices are effectively relevant for the scan time. This applies analogously to three-dimensional magnetic resonance sequences, where instead of slices, there is a second phase-encoding direction.

SUMMARY AND DESCRIPTION

The scope of the present invention is defined solely by the appended claims and is not affected to any degree by the statements within this summary.

The present embodiments may obviate one or more of the drawbacks or limitations in the related art. For example, calculation of a B0 map is accelerated, and time in the determination of shim parameters is saved.

U.S. Pat. No. 8,379,946 B2 discloses a method for the determination of an adjustment volume.

In a preliminary scan, the magnetic resonance device is used to ascertain extension information describing the extension of the object using a scout sequence, where this information is used to define the recording region in sequence parameters of the map recording sequence and/or to adjust at least one sequence parameter of the map recording sequence describing the spatial position of the slice selection direction and/or the least one phase encoding direction and/or the readout direction.

One or more of the present embodiments provide a fast calculation of the object (e.g., the patient) to be performed by a scout sequence. This is to be used as the basis for adjusting the sequence parameters of the map recording sequence such that that the B0 field map is only recorded where necessary (e.g., where the object is present), and the directions used in the map recording sequence may also be adjusted to the extensions such that the ascertainment of the B0 map may be as time efficient as possible. Herein, in the following, the examples frequently refer to slice-based map recording sequences; however, this does not restrict the present invention, which may also be applied analogously to three-dimensional map recording sequences with two phase-encoding directions.

For the respective position of a patient table of the magnetic resonance device, only precisely the recording region (e.g., the volume with which the B0 map is acquired) in which the object is completely contained is acquired. In order to acquire the necessary extension information, which, for example, describes the extension and hence the position of the object, before the B0 field map is scanned, a very short scout scan, which may also be referred to as a shim scout, is performed. For example, an adjustment algorithm held in an adjustment unit of a control device of the magnetic resonance device determines sequence parameters for the subsequent map recording sequence dynamically from the extension information. The objective is to dynamically adjust the extension, possibly the resolution and alignment, of the necessary recording region for the B0 map such that the object (e.g., at this position of the patient table) is acquired completely using the minimal scan time (e.g., with a defined image element size). Both the spatial alignment of the map recording sequence and the size and position of the recording region (e.g., scan volume) may be dynamically parameterized in combination with the number of slices and/or the number of phase-encoding steps.

The overall duration of scout sequence to ascertain the extension information is less than 0.5 seconds.

In a development, the scout sequence (e.g., embodied as a gradient echo or spin echo sequence) includes three one-dimensional scans in three different scan directions (e.g., mutually perpendicular main directions of the magnetic resonance device along the center axis of the patient receiving region and perpendicularly horizontally and vertically thereto). Therefore, the scout sequence may include only three readouts (e.g., readout procedures) for three different scan directions that, for example, correspond to the main directions of the magnetic resonance device. Typically, the longitudinal direction of the patient receiving region (e.g., Z-direction), the horizontal direction perpendicular thereto (e.g., X-direction) and the vertical direction perpendicular thereto (e.g., Y-direction) are used as the main directions in magnetic resonance devices with a cylindrical patient receiving region in a main magnet unit. In the case of a patient introduced with perfect alignment in the longitudinal direction into the patient receiving region, the Z-direction would substantially correspond to the transversal direction, the Y-direction would substantially correspond to the coronal direction, and the X-direction would substantially correspond to the sagittal direction.

For each of the three readout procedures, the complete recording region is excited then refocused (e.g., by spin- or gradient-echo methods) and finally read out using a corresponding readout gradient. This enables scan times of from less than 100 ms up to a few 100 ms to be achieved. Ultimately, therefore, the scout sequence combines three one-dimensional magnetic resonance sequences in three different scan directions (e.g., the main directions of the magnetic resonance device).

A maximum extension of the object in the scan directions may be determined from the scan data of the scout sequence as extension information. Simple Fourier transformation and absolute-value generation of the acquired magnetic resonance signals in the three scan directions enable the extension of the object (e.g., the patient) to be estimated integrally. To obtain extension information that is as unadulterated as possible, a distortion correction may be performed based on the distortion correction data describing the known non-linearity of the gradients, as is also known in principle for imaging scans. For the actual object recognition in the scan data/scan results of the scout sequence, different evaluation methods for one-dimensional magnetic resonance sequences that are known, in principle, may be used, so that, for example, a threshold value (e.g., as five percent of the maximum scan value) may be ascertained in order to segment the object in the scan data. In this context, an outlier detection (e.g., to cut off some of the highest scan values) may be performed to, for example, avoid setting the threshold value too high. In one embodiment, histogram analyses and/or noise-based analyses may be carried out in order to improve the evaluation of the scan data in the scout sequence.

The results of the scan data of the scout sequence are, for example, absolute maximum object extensions in the three scan directions (e.g., the main directions of the magnetic resonance device). For example, six scalar quantities may be obtained (e.g., $X_{max}$, $X_{min}$ for the X-direction, $Y_{max}$, $Y_{min}$ for the Y-direction, and $Z_{max}$, $Z_{min}$ for the Z-direction).

A further embodiment with respect to the scout sequence provides that a flip angle of less than 20 (e.g., less than 10°) is used. The use of the smallest possible flip angle provides that as few spins as possible are excited, so that as many spins as possible are available for the subsequent B0 map scanning or the waiting time is as short as possible.

Depending upon the spatial resolution offered by the scout sequence and/or the spatial, non-corrected, distortion to be expected, the maximum extension in the scan directions determined by the evaluation of the scan data in the scout sequence may be expanded by an added safety margin. For example, the object, or the proportion of the homogeneity volume occupied thereby, is in each case completely acquired by the calculation of the B0 map. This added safety margin is less than 5 cm (e.g., less than 1 cm).

In an embodiment of the method, during the adjustment of the map recording sequence, object information describing the object (e.g., patient information) and/or local coil information describing a local coil used may be used as at least one item of additional information, for example, for establishing the plausibility and/or refining the scan results of the scout sequence. Therefore, further available items of information (e.g., from the adjustment algorithm) may be used in order to utilize as much knowledge as possible about the possible extension and/or position of the object. Examples of this include information on the patient positioning, the use of local coils, and the like. For example, with head-first-supine (HFS) positioning and the use of a local head coil, it may be assumed that the object extension in the negative Z-direction is constrained to the interior of the local head coil. Object extensions may also be estimated with head-first-prone (HFP) positioning using a chest local coil. For example, information on the position/extension (e.g., the space occupied) of local coils has been found to be extremely useful since such information constrains the available proportional occupation of the homogeneity volume in which the object may be located. For example, an embodiment provides that local coil information describing a region occupied by the local coil is used to constrain the recording region. If, for example, as discussed above, added safety margins are used, these may be reduced or even omitted in view of the arrangement (e.g., exactly known arrangement) of the local coil at least at times in which the object abuts the local coil. Therefore, the recording region to be scanned for the B0 map may be further constrained with confirmed information. In conjunction with local coil information of this kind, as already discussed above, patient orientation may be useful as object information.

In a development, the extension of the recording region is limited to a homogeneity volume of the magnetic resonance device. Since nothing is to be scanned outside the homogeneity volume and greater inhomogeneities occur, the maximum recording region may be restricted to the homogeneity volume if the object has a greater extension than the homogeneity volume in at least one direction. The scout sequence is then to at least cover the homogeneity volume, where no harm is caused by the fact that the main magnetic field becomes more inhomogeneous toward the edge of the homogeneity volume, and hence, the edge of the object is blurred if the edge of the object is located outside the homogeneity volume. This is because it may be established that, in this scan direction, the object evidently at least fills the homogeneity volume so that the map recording sequence correspondingly then is to acquire the entire homogeneity volume in this scan direction. If the object is smaller in one scan direction, this may be reliably identified.

As already mentioned, the adjustment of the map recording sequence may be performed such that optimization is performed with respect to the shortest possible overall scan time of the map recording sequence. Alternatively, a substantially constant overall scan time of the map recording sequence may be used to increase spatial resolution. However, a reduction of the overall scan time is, for example, more advantageous in that magnetic resonance scans take a very long time and may, therefore, be reduced for better utilization of the magnetic resonance device and to increase patient comfort. However, when optimizing the time of the map recording sequence in the context of the adjustment of the sequence parameters as a function of the extension information, the incorporation of technical constraints of the magnetic resonance device and/or disadvantageous impacts of certain adjustment measures may be provided, for example, as boundary conditions. For example, any possible drawbacks may be taken account of since technical constraints of the magnetic resonance device are to be taken into account anyway. Such possible disadvantageous impacts include, for example, the occurrence of fold-overs with a selection of the phase encoding direction in which the extension of the object exceeds the homogeneity volume and/or a lower acceleration with a parallel recording technique, if a lower number of coil elements is present in one potential phase encoding direction than in other directions. Therefore, it despite a time gain, the establishment of a sequence direction (e.g., phase encoding directions) may also result in drawbacks. For example, fold-overs may develop along the phase-encoding direction if the object has a greater extension than the recording region, which is, for example, constrained to the homogeneity volume. Problems may also occur with a parallel recording technique (PRT) used for the scanning of the B0 map if the phase encoding direction is a direction in which only a few or no coil elements of a coil arrangement used for the parallel recording technique lie in sequence. This may be taken into account accordingly.

In an embodiment, the selection of the slice selection direction and/or the least one phase encoding direction and/or the readout direction may be made as a function of the relative extension of the object in at least three candidate directions (e.g., the main directions). For example, in view of the temporal acceleration of the recording of the B0 map, in many cases, the readout direction may be established along the longest extension, where the next smallest extension may, for example, be established in the phase-encoding direction. In these cases, any drawbacks that may occur may be taken account of so that the next smallest extension may, for example, then be established in the slice selection direction when the other remaining direction is more suitable for a parallel recording technique to be used.

In specific exemplary applications, embodiments of the method in which the sequence directions (e.g., slice selection direction, phase-encoding direction, and readout direction) are left as fixed and the only adjustment made is with respect to a reduced recording region compared to the homogeneity volume may be provided. If, for example, the X-direction of the magnetic resonance device is established as the readout direction, the Y-direction of the magnetic resonance device is established as the phase encoding direction, and the Z-direction of the magnetic resonance device is established as the slice selection direction, phase-encoding steps for the Y-direction and slices for the Z-direction may be omitted. In a second embodiment, the readout direction may correspond to the Z-direction, the phase encoding direction may always correspond to the X-direction (e.g., with parallel recording techniques), and the slice selection direction may always correspond to the Y-direction so that it is again possible to omit phase-encoding steps and slices if the extension of the object in the corresponding sequence directions is less than the extension of the homogeneity volume. However, with these two exemplary embodiments with fixed sequence directions, in the first case, drawbacks may occur with long objects in the Z-direction and narrow objects in the X-direction (e.g., a knee and/or foot), thus failing to achieve time optimality. In the second case, the lack of flexibility with certain object extension may entail similar problems. Accordingly, in the context of one or more of the present embodiments, the sequence directions may be selected at least partially dynamically.

In one embodiment, the slice selection direction may be left fixed (e.g., in the Z-direction), while the readout direction and the phase-encoding direction may be selected dynamically. The readout direction may always be selected in the longer remaining extension, which would generally correspond to the X-direction or, with a left-right position, the Y-direction. Once again, phase-encoding steps/slices may be correspondingly omitted in the phase-encoding direction and in the slice selection direction in order to achieve shorter overall scan times for the map recording sequence. Maximum time optimization is enabled if all sequence directions may be selected dynamically (e.g., the readout direction is always selected as the direction of the greatest extension, and the next smallest extension is established in the phase-encoding direction or the slice selection direction). The above-named potential drawbacks with respect to the phase-encoding direction and the slice selection direction may be considered in order to provide corresponding criteria for the selection thereof. For example, the phase-encoding direction may be automatically established such that parallel recording techniques may be used optimally, where, simultaneously, care may be taken to provide that the phase-encoding direction is not selected such that problems with fold-overs may occur or become severe.

The present embodiments may achieve the advantage that the scan times for B0 maps are shorter since the recording region is restricted to the actually necessary volume. On average, a saving of from 30% to 50% in overall scan time is achieved. With a present-day scan time of from typically 15 seconds up to sometimes over 30 seconds, significant accelerations in B0 map scanning may be achieved.

Several examples of potential savings in the overall scan time for the B0 map are provided. If the patient is in the HFS position, at present, the scan is performed over 450 mm in the Y-direction. However, typically, if the patient is in the anterior-posterior direction in this position, the extension is only up to 250 mm, thus, for example, enabling a saving of about 45% of scan time. In another example, with the present procedure, a B0 field map is scanned by a DESS magnetic resonance sequence in the Y-direction from the upper edge of bench without a spine coil/back coil as far as the upper end of the homogeneity volume so that, with scans without a local coil (e.g., on the breast), the scan is also performed right down to the lowest point. Hence, whenever a local coil is used, at least the thickness of the local coil (e.g., a spine coil/back coil) may be saved in scan time.

In a further example, a scan is to be performed on a knee and/or on the hand/arm in a "Superman" position. Herein, significant savings may be achieved in both the X-direction and the Y-direction since in each case typically only 150 mm coverage is to be provided. The same applies with recordings on the foot. Here, it is also possible to save on the recording region and hence the scan time in the negative Z-direction (e.g., in the feet-first-supine (FFS) position). There is also a significant potential for saving on the overall scan time for the B0 map with respect to the head since, due to the extension of the recording region, reductions are possible in the negative Z-direction (e.g., in the HFS position) and in each case in the positive and negative X-direction and Y-direction.

Scanning with the scout sequence is a simple, robust, and quick scan variant for the identification of object dimensions. From this, time-optimized sequence parameters may be ascertained for the map recording sequence by an adjustment algorithm or an adjustment unit.

A fundamentally manual variant of the procedure according to one or more of the present embodiments, with which a user calculates the object and establishes the alignment, possibly the resolution, the position and the size of the recording region, may be provided, but the manual activities result in a loss of time that may even outweigh any time gain.

The adjustment of the map recording sequence and/or the B0 map may be stored assigned to a current position of a patient table of the magnetic resonance device at least for a present examination procedure on the present object. The information obtained (e.g., the B0 map) may be stored for the corresponding position of the patient table so that the information obtained may, for example, be used again for further imaging scans at the same table position.

The scanned B0 map may be evaluated to ascertain at least one shim parameter of a shim direction of the magnetic resonance device. For example, it is, therefore, possible to ascertain shim currents of shim coils in the shim direction as a function of the B0 map. The B0 map may also be used for other applications (e.g., with respect to special separation strategies for fat and water and the like).

In addition to the method, the present embodiments also relate to a magnetic resonance device with a control device embodied to carry out the method. All statements relating to the method according to the present embodiments may be transferred analogously to the magnetic resonance device according to the present embodiments, and hence, the aforementioned advantages may also be achieved herewith. For example, therefore, the control device may include a control unit for controlling the other components of the magnetic resonance device for recording scan data in order, for example, to use the scout sequence and the map recording sequence for the scan. The control device may also include an extension-determining unit in order to ascertain the extension information, and an adjustment unit for adjusting the sequence parameters of the map recording sequence. Further embodiments may require further corresponding assigned units (e.g., an optional shim unit, a storage unit and the like).

A computer program according to the present embodiments may, for example, be loaded directly into a memory of a control device of a magnetic resonance device and includes program code for carrying out the acts of a method described herein when the computer program is executed in the control device (e.g., a processor) of the magnetic resonance device. The computer program according to the present embodiments may be stored on an electronically readable data medium (e.g., a non-transitory computer-readable storage medium). This correspondingly includes electronically readable control information stored thereupon that includes at least one such computer program and is embodied to carry out a method as described herein when the data medium is used in a control device of a magnetic resonance device. The data medium may be, for example, a non-transient data medium such as a CD-ROM.

BRIEF DESCRIPTION OF THE DRAWINGS

FIG. 1 shows a flow diagram of an exemplary embodiment of a method;

FIG. 2 shows a sketch illustrating a method according to an embodiment; and

DETAILED DESCRIPTION

Figure 3:
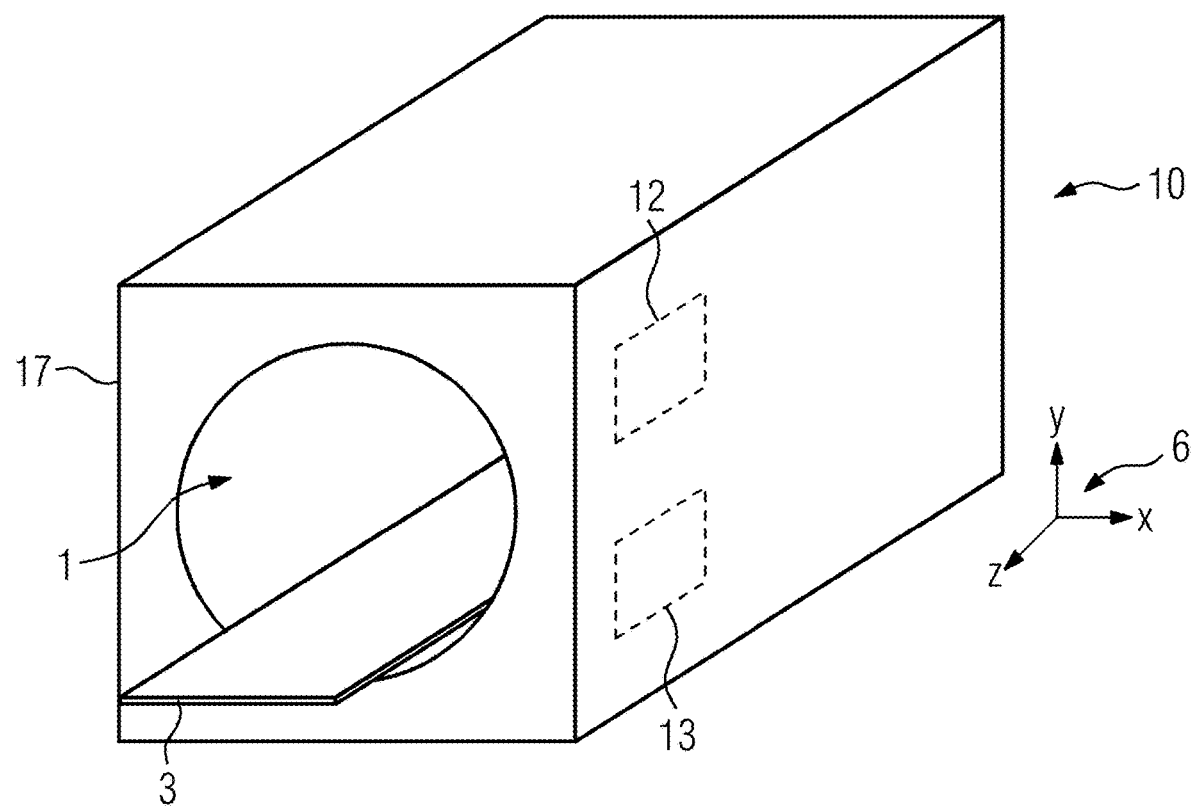
FIG. 3 shows one embodiment of a magnetic resonance device.

FIG. 1 shows a flow diagram of one embodiment of a method such as may be performed in a magnetic resonance device by a control device. The present case relates to a conventional magnetic resonance device with a cylindrical patient receiving region into which the patient may be introduced as an object to be examined for the performance of an imaging scan. Herein, to facilitate the avoidance of inhomogeneities of the main magnetic field also generated by the actual patient to the greatest degree possible, the magnetic resonance device has a shim direction with a plurality of shim coils that may be installed as part of a local coil, provided in a gradient coil arrangement or also arranged in some other way.

The ascertainment of suitable shim currents as shim parameters for the shim coils requires a B0 map (e.g., a map of the main magnetic field of the magnetic resonance device that is to be recorded during the examination procedure while the patient is already in position in order to be able to scan the individual changes in the main magnetic field caused by the patient). However, before the actual B0 map is calculated by a map recording sequence as a magnetic resonance sequence, in act S1, a scout sequence is used to be able to determine the extension of the patient in the homogeneity volume (e.g., relevant for the imaging). The scout sequence embodied as, for example, a spin echo sequence includes three one-dimensional scans in three different scan directions that, in the present case, correspond to the main directions of the magnetic resonance device. The main directions of the magnetic resonance device are the Z-direction along the longitudinal axis of the patient receiving region, the X-direction perpendicular to the Z-direction horizontally, and the Y-direction perpendicular to the Z-direction vertically. To keep excitation as low as possible and keep the waiting time until the performance of the map recording sequence low, the lowest possible flip angle is used (e.g., a flip angle of less than 10°).

In act S2, the maximum extensions of the patient in the main directions are ascertained from the scan data recorded with the scout sequence as extension information. Conventional methods for segmentation in one-dimensional magnetic resonance images may be used, for example, to mark the patient as the location at which the scanned magnetic resonance signal reaches 5% of the maximum magnetic resonance signal (e.g., after outlier detection). Correspondingly, this produces a maximum extension as an absolute value (e.g., the values $X_{max}$, $X_{min}$, $Y_{max}$, $Y_{min}$, $Z_{max}$ and $Z_{min}$). Herein, it may also be established whether the patient completely fills the homogeneity volume.

In act S3, the extension information, optionally together with additional information, is used to adjust various sequence parameters of the map recording sequence (e.g., the sequence parameters defining the recording region and the sequence parameters defining the sequence directions such as slice selection direction, phase encoding direction, and readout direction). For the sake of simplicity, a case is assumed in which main directions of the magnetic resonance device are used as the sequence directions; however, the procedure may also be transferred to any directions.

The recording region as the scan volume is selected in act S3 such that the scan volume includes the patient. This is explained in more detail with reference to FIG. 2, which shows a schematic section through the patient receiving region 1 of the magnetic resonance device. A patient 2 is introduced by a patient table 3 so that a region to be examined of the patient 2 comes to lie within the homogeneity volume 4. Also identifiable is a local coil 5 on which the patient lies supine (e.g., HFS position). The local coil 5 is, for example, a spine or back coil. Information on the use of the local coil 5 and the space inside the patient receiving region 1 occupied by the local coil 5 is contained as local coil information in the additional information; the position of the patient on the patient table 3 (e.g., head-first-supine) is also available as patient information. Also shown is a coordinate system 6 indicating the main directions of the magnetic resonance device.

Since the position of the local coil 5 is known, it is clear that the patient 2 may not be located there, but is lying on the local coil 5 so that the delimitation of the patient 2 in the negative Y-direction is already relatively clearly defined and may be derived from the additional information. In act S2, the additionally performed scout scan of act S1 provides the maximum extensions of the patient 2 (e.g., identifiably the maximum extension 7 in the Y-direction and the maximum extension 8 in the Z-direction). In the present case, the patient 2 does not completely fill the homogeneity volume 4 in the Y-direction, and this is also the case with the X-direction, which is not shown. Since the Z-direction corresponds to the transversal direction of the patient 2 and is to be scanned in the torso region, it is not surprising that the patient completely fills the homogeneity volume 4 in the Z-direction.

Therefore, the recording region 9 is defined using this maximum extension, where, depending upon the accuracy of the scout sequence and the assumed distortion, it is possible to add a small safety margin to provide that the patient 2 is actually fully covered. This added safety margin does not have to be applied to the upper limit of the local coil 5 or may be reduced since more accurate knowledge is available due to the additional information. The maximum size of the recording region in the directions is defined by the extension of the homogeneity volume thus resulting in the extension 8 in the Z-direction (e.g., the patient 2 extends over the entire homogeneity volume).

In addition to the definition of the recording region, which has consequences for sequence parameters, as already explained, the sequence directions are also skillfully chosen in a dynamic way. In the present exemplary embodiment, all sequence directions may be assigned dynamically in order to keep the overall scan time of the map recording sequence as small as possible under certain boundary conditions. However, exemplary embodiments in which sequence directions are "held fixed" may also be provided.

For the slice-based map recording sequence in this example, the greatest extension of the recording region 9 is used to define the readout direction, which may, for example, be selected as the Z-direction. This also has the advantage that the Z-direction does not have to be selected as the phase encoding direction, which would result in the risk of fold-overs and may be avoided by suitable boundary conditions. The two other sequence directions are assigned such that the sequence directions most closely match the parallel recording technique provided. The phase encoding direction may, for example, be selected as the X-direction since there is a sequence of a plurality of coils elements of the local coil 5 and this simplifies parallel imaging. Consequently, the Y-direction is used as the slice selection direction. The definition of the recording region thus produces the number of phase-encoding steps required and the number of slices required. This act would then also take place for the corresponding extension if the sequence directions were specified as fixed.

The sequence parameters relating to the sequence directions and the recording region are, as mentioned, limited by boundary conditions that may relate to technical limitations of the magnetic resonance device and to the drawbacks that occur with the selection of certain directions as certain sequence directions, as already explained with respect to parallel recording techniques, and the possibility of fold-overs in the phase encoding direction.

In act S4, the B0 map is recorded by the map recording sequence as a magnetic resonance sequence, where in act S3, certain sequence parameters are used. The B0 map is stored assigned to the current position of the patient table 3.

In act S5, the scanned B0 map is then used to determine shim parameters of the shim direction (e.g., shim currents for the shim coils) in order to compensate inhomogeneities of the main magnetic field caused by the patient 2.

FIG. 3 shows a schematic sketch of one embodiment of a magnetic resonance device 10. This includes a main magnet unit 11 in which the patient receiving region 1 is embodied. The patient bench 3 is again shown (e.g., in a partially extended position). As is known, in principle, a radio-frequency coil arrangement and a gradient coil arrangement surrounding the patient receiving region 1 may be provided (not shown in more detail here). As also known in principle, the patient table 3 may include connections for local coils 5.

The operation of the magnetic resonance device 10, also including the shim direction 12 that is only indicated here, is controlled by a control device 13 that is also only indicated in FIG. 3. The control device 13 (e.g., including one or more processors) is embodied to carry out the method according to one or more of the present embodiments. In addition to the conventional sequence unit for controlling the recording operation, the control device 13 also includes an extension-determining unit for carrying out act S2 and an adjustment unit for carrying out act S3.

Although the invention was illustrated and described in more detail by the exemplary embodiments, the invention is not restricted by the disclosed examples, and other variations may be derived herefrom by the person skilled in the art without leaving the scope of protection of the invention.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent, and that such new combinations are to be understood as forming a part of the present specification.

While the present invention has been described above by reference to various embodiments, it may be understood that many changes and modifications may be made to the described embodiments. It is therefore intended that the foregoing description be regarded as illustrative rather than limiting, and that it be understood that all equivalents and/or combinations of embodiments are intended to be included in this description.

The invention claimed is:

1. A method for recording a B0 map of a main magnetic field of a magnetic resonance device in an imaging volume of which an object to be recorded is arranged, the method comprising:
    ascertaining the B0 map, the ascertaining of the B0 map comprising scanning, by the magnetic resonance device, a recording region to be covered by the B0 map by a map recording sequence slice-by-slice in successive slices in a slice selection direction extending in a phase encoding direction and a readout direction, or three-dimensionally using two phase encoding directions and one readout direction;
    ascertaining, using the magnetic resonance device, in a preliminary scan, extension information describing an extension of the object using a scout sequence that is used to define the recording region in sequence parameters of the map recording sequence, to adjust at least one sequence parameter of the map recording sequence describing a spatial position of the slice selection direction, the phase encoding direction or the two phase encoding directions, the one readout direction, or any combination thereof, or define the recording region in sequence parameters of the map recording sequence and adjust at least one sequence parameter of the map recording sequence.

2. The method of claim 1, wherein the scout sequence comprises three one-dimensional scans in three different scan directions.

3. The method of claim 2, wherein the three different scan directions include mutually perpendicular main directions of the magnetic resonance device along a center axis of the patient receiving region and horizontally and vertically perpendicular thereto.

4. The method of claim 2, wherein a maximum extension of the object in the three different scan directions is determined from scan data of the scout sequence as extension information.

5. The method of claim 1, further comprising adjusting the at least one sequence parameter of the map recording sequence,
    wherein during the adjusting of the map recording sequence, object information describing the object, local coil information describing a local coil, or the object information describing the object and the local coil information describing the local coil are used as at least one item of additional information.

6. The method of claim 5, wherein local coil information describing a region occupied by the local coil is used to constrain the recording region, patient orientation is used as object information, or the local coil information describing the region occupied by the local coil is used to constrain the recording region and patient orientation is used as object information.

7. The method of claim 1, wherein the extension of the recording region is restricted to a homogeneity volume of the magnetic resonance device.

8. The method of claim 1, further comprising adjusting the at least one sequence parameter of the map recording sequence,
    wherein during the adjusting of the map recording sequence, optimization is performed with respect to a shortest possible overall scan time of the map recording sequence.

9. The method of claim 8, wherein during the adjusting of the map recording sequence, optimization is performed based on an occurrence of fold-overs, an extension of the homogeneity volume, a number of local coil elements, a position of the local coil elements, or any combination thereof.

10. The method of claim 1, further comprising selecting the slice selection direction, at least one phase encoding direction, the one readout direction as a function of a relative extension of the object in at least three spatial directions.

11. The method of claim 10, wherein the at least three candidate directions are main directions.

12. The method of claim 1, further comprising adjusting the at least one sequence parameter of the map recording sequence,
    wherein during the adjustment of the map recording sequence, the B0 map, or the adjustment of the map recording sequence and the B0 map are stored assigned to a current position of a patient table of the magnetic resonance device at least for a present examination procedure on the present object.

13. The method of claim 1, further comprising ascertaining at least one shim current of a shim direction of the magnetic resonance device, the ascertaining of the at least one shim current comprising evaluating the scanned B0 map.

14. A magnetic resonance device comprising:
    a controller configured to:
        record a B0 map of a main magnetic field of a magnetic resonance device in an imaging volume of which an object to be recorded is arranged, record of the B0 map comprising:

ascertainment of the B0 map, the ascertainment of the B0 map comprising scan of a recording region to be covered by the B0 map by a map recording sequence slice-by-slice in successive slices in a slice selection direction extending in a phase encoding direction and a readout direction, or three-dimensionally using two phase encoding directions and one readout direction;

ascertainment, in a preliminary scan, extension information describing an extension of the object using a scout sequence that is used to define the recording region in sequence parameters of the map recording sequence, to adjust at least one sequence parameter of the map recording sequence describing a spatial position of the slice selection direction, the phase encoding direction or the two phase encoding directions, the one readout direction, or any combination thereof, or define the recording region in sequence parameters of the map recording sequence and adjust at least one sequence parameter of the map recording sequence.

15. In a non-transitory computer-readable storage medium that stores instructions executable by one or more processors to record a B0 map of a main magnetic field of a magnetic resonance device in an imaging volume of which an object to be recorded is arranged, the instructions being executable by the one or more processors to:

ascertain the B0 map, the ascertaining of the B0 map comprising scanning, by the magnetic resonance device, a recording region to be covered by the B0 map by a map recording sequence slice-by-slice in successive slices in a slice selection direction extending in a phase encoding direction and a readout direction, or three-dimensionally using two phase encoding directions and one readout direction; and ascertain, using the magnetic resonance device, in a preliminary scan, extension information describing an extension of the object using a scout sequence that is used to define the recording region in sequence parameters of the map recording sequence, to adjust at least one sequence parameter of the map recording sequence describing a spatial position of the slice selection direction, the phase encoding direction or the two phase encoding directions, the one readout direction, or any combination thereof, or define the recording region in sequence parameters of the map recording sequence and adjust at least one sequence parameter of the map recording sequence.

* * * * *